United States Patent [19]

Nagumo

[11] Patent Number: 5,352,131
[45] Date of Patent: Oct. 4, 1994

[54] IC SOCKET

[75] Inventor: Takayuki Nagumo, Kanagawa, Japan

[73] Assignee: Minnesota Mining and Manufacturing Company, St. Paul, Minn.

[21] Appl. No.: 71,583

[22] Filed: Jun. 2, 1993

[30] Foreign Application Priority Data

Jun. 2, 1992 [JP] Japan .................. 4-141381

[51] Int. Cl.⁵ .............................. H01R 13/62
[52] U.S. Cl. ........................ 439/266; 439/70
[58] Field of Search ..................... 439/68-73, 439/259-270, 330, 331

[56] References Cited

U.S. PATENT DOCUMENTS

| | | |
|---|---|---|
| 4,623,208 | 11/1986 | Kerul et al. |
| 4,715,823 | 12/1987 | Exera et al. ................ 439/267 |
| 4,789,435 | 12/1988 | Carter ........................ 439/266 |
| 4,846,703 | 7/1989 | Matsuoka et al. ........ 439/71 |
| 4,872,850 | 10/1989 | Mogi et al. ................ 439/266 |
| 4,886,470 | 12/1989 | Billman et al. ............ 439/266 |
| 5,076,798 | 12/1991 | Uratsuji .................... 439/269 |
| 5,114,358 | 5/1992 | Myers ....................... 439/266 |
| 5,154,620 | 10/1992 | Martucci et al. ........ 439/73 |

Primary Examiner—Larry I. Schwartz
Assistant Examiner—Hien D. Vu
Attorney, Agent, or Firm—Gary L. Griswold; Walter N. Kirn; John C. Barnes

[57] ABSTRACT

An IC socket for testing various IC packages is has guide sections to restrict the cover from tilting during operation without providing guide posts at four corners of the socket. The IC socket has a body with a plurality of contacts for electrical contact with leads of an IC package and a cover releasably loading the IC package on the socket body by vertical movement, a plurality of guide sections extending vertically being formed on the respective insides of four side surfaces of the cover, and a plurality of engaging sections for engaging with the guide sections, supporting vertical movement of the cover and preventing the cover from tilting during testing of the IC package, being formed respectively, on four side surfaces of the socket body.

1 Claim, 11 Drawing Sheets

IC SOCKET

BACKGROUND OF THE INVENTION

1. Field of the Invention

The present invention relates to an IC socket used for testing of various IC packages, such as QFP (Quad Flat Package), SOP (Small Outline Package) and so forth.

Typically, IC packages are tested in some manner to ensure their proper functions. The present invention relates to the IC socket which enables various tests for a plurality of IC packages quickly and certainly.

2. Description of the Prior Art

One of the tests for IC packages is the burn-in test, in which the IC package is inserted into the IC socket and thereafter installed within a convection oven for testing high-temperature characteristics of the IC package under elevated temperature.

IC sockets used for the above-mentioned burn-in test are known and some are adapted for testing using automatic equipment. For example, U.S. Pat. Nos. 4,623,208 and 4,886,470 disclose IC sockets adapted to automated-type testing apparatus.

FIG. 6 shows the conventional IC socket disclosed in U.S. Pat. No. 4,623,208. In further detail, FIG. 6 is a perspective view showing a normal condition before testing, FIG. 7 is an exploded perspective view showing overall construction, FIG. 8 is a section of the condition, in which the IC package is inserted, as taken along line A—A of FIG. 6, and FIG. 9 is a section of the condition, in which the IC package is installed, as taken along line A—A of FIG. 6.

FIGS. 10 to 12 show the conventional IC socket disclosed in U.S. Pat. No. 4,886,470. In further detail, FIG. 10 is a perspective view in the normal state before testing, FIG. 11 is a section of the condition, in which a lead of the IC package is contacting the contact, as taken along line B—B of FIG. 10, and FIG. 12 is a section of the condition, in which a lead of the IC package is held in non-contact with the contact, as taken along line B—B of FIG. 10.

As illustrated, the above-mentioned two kinds of IC sockets comprise socket bodies 10, covers 20 and a plurality of contacts 30. Each of the contacts 30 has a contact section 40 for electrical contact with the lead L of the IC package P (strictly speaking, a pad of a chip carrier corresponds to the lead in the first prior art example FIGS. 6 to 9), a cantilever section 50 for rotating the contact section 40 to enable connection and releasing between the lead L and each contact 30.

Here, when the cover 20 is depressed downwardly against a resilient force (reacting force) of the contact 30, the above-mentioned contact 30 is forcingly displaced outwardly to place the contact 30 and the lead L of the IC package P into the non-contacting state to release connection therebetween. Accordingly, in this condition, insertion and removal (loading and unloading) of the IC package P can be performed. When the depression force on the cover 20 is removed, the contact 20 is rotated in the reverse direction to restore connection with the lead L of the IC package P.

However, in the above-mentioned IC socket, when the cover 20 is operated for testing the IC package, if the depression force on the cover 20 is offset, the cover 20 may move downwardly in a tilting position. AS a result, sufficient rotation cannot be obtained at the contact, on which the depression force is insufficient, and problems can arise in insertion and removal of the IC package.

In order to solve this problem, there has been proposed an IC socket which can prevent the cover 2 from tilting upon operation by providing guide posts or so forth at four corners of a socket body 1 and the cover 2. However, in case of this IC socket, the four corners of the socket 1 and the cover 2 cannot be for other uses, such as screw holes for fixing the socket body, or holes for the positioning of an automatic loader.

The present invention is established in view of the above-mentioned problems. It is an object of the present invention to provide an IC socket which can prevent a cover from tilting during operation without providing guide posts or so forth at four corners of the socket body and the cover.

SUMMARY OF THE INVENTION

The present invention provides an IC socket including a socket body formed with a plurality of contacts for electrical contact with leads of an IC package and a cover releasably loading the IC package on the socket body by vertical movement. Further, a plurality of guide sections extending vertically are formed on the respective insides of four side surfaces of the cover, and a plurality of engaging sections for engaging with the guide sections, supporting vertical movement of the cover and preventing the cover from tilting during testing of the IC package, are formed respectively, on four side surfaces of said socket body.

In the IC socket according to the present invention, paying attention to the fact that an available space is left on the inside of the side surface of the cover, the guide section, such as grooves, having the function of guide posts, is formed on the inside of the four side surfaces of the cover, and the engaging sections, such as ribs, which engage with the grooves, are formed on the side surface of the socket body. With such construction, when the cover is depressed downwardly for loading and unloading the IC package, the cover shifts downwardly along the ribs on four side surfaces without causing tilting. Therefore, the problems in loading and unloading of IC package as in the prior art, are restricted. Furthermore, since it is unnecessary to form guide posts or so forth at the four corners of the socket, the corners can be advantageously used for other purposes.

Therefore, according to the present invention, it becomes possible to provide an IC socket which can prevent the cover from tilting during operation without using the space at the four corners of the socket body.

DETAILED DESCRIPTION OF THE PREFERRED EMBODIMENTS

Figure 1:
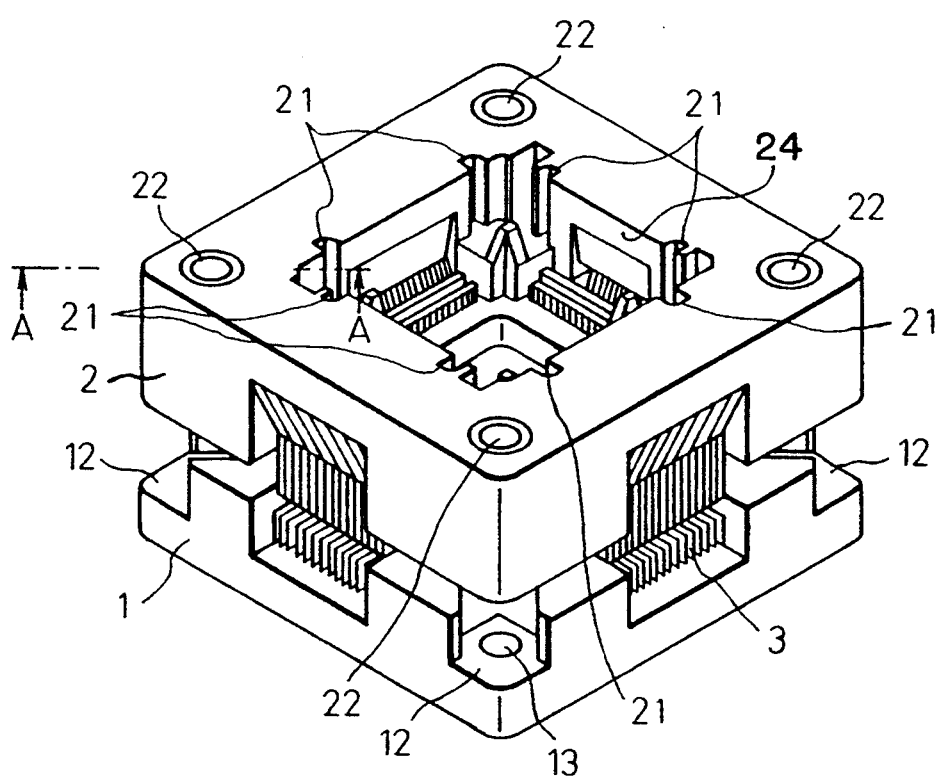
FIG. 1 is a perspective view of an IC socket according to the present invention in a normal state before testing.
Figure 2:
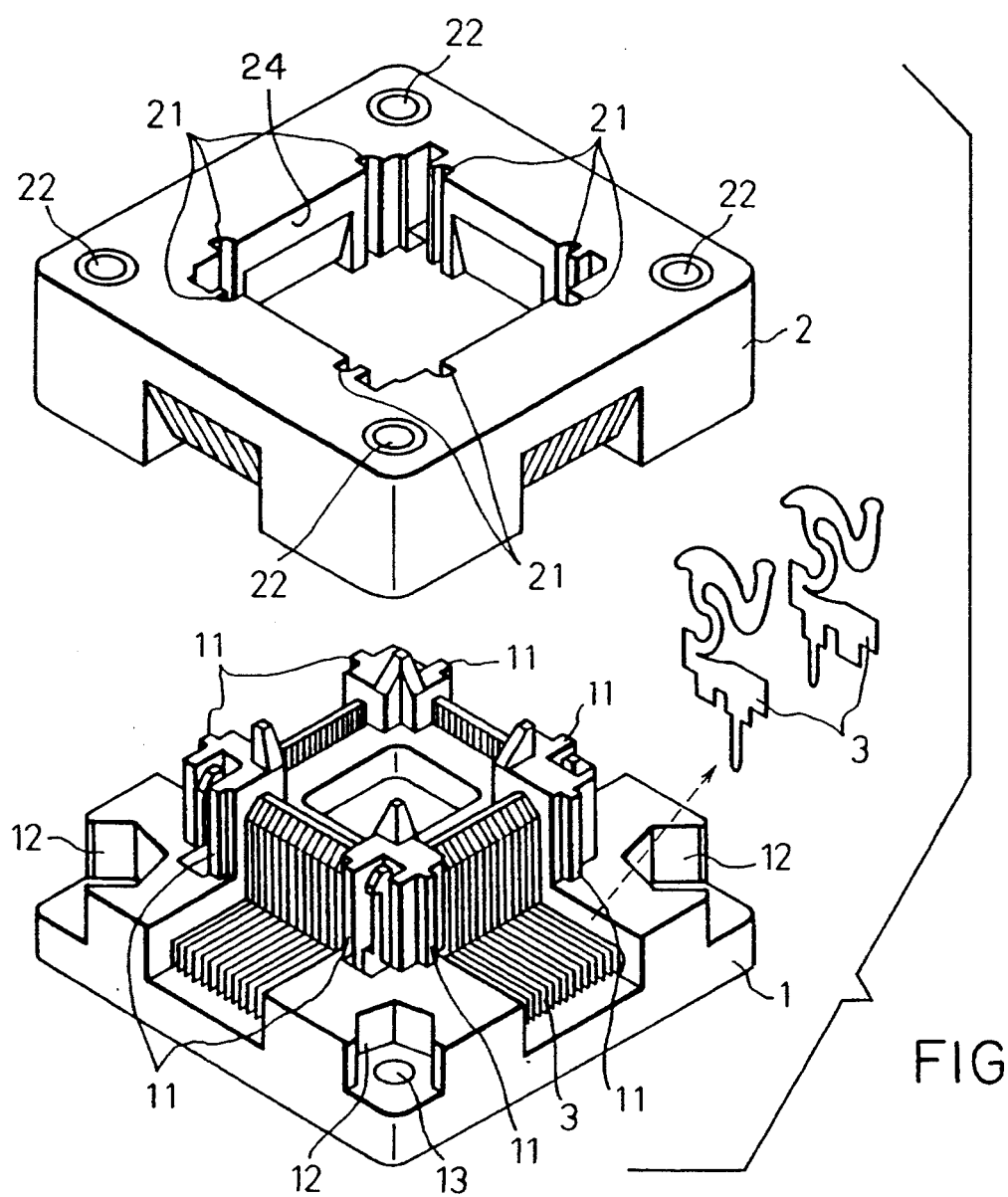
FIG. 2 is an exploded perspective view of the overall construction of the IC socket according to the present invention.
Figure 3:
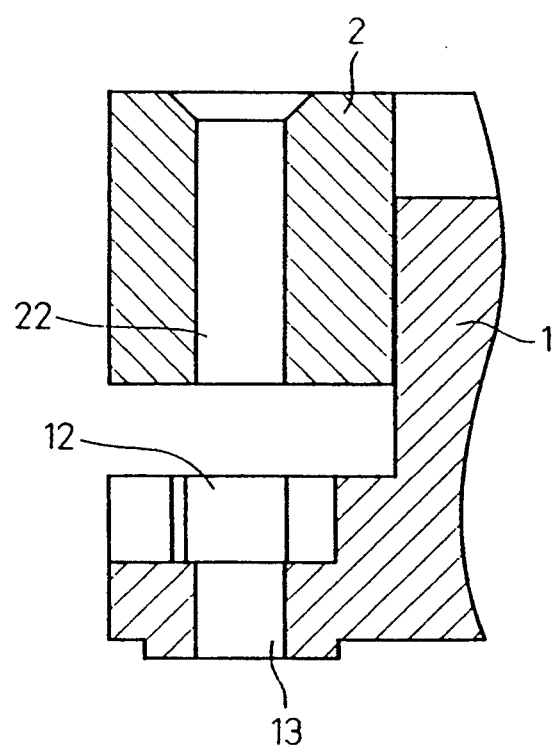
FIG. 3 is a detail sectional view taken along the line A—A of FIG. 1.

FIGS. 1 and 2 are illustrations showing one embodiment of an IC socket according to the present invention, wherein FIG. 1 is a perspective view showing normal space before testing and FIG. 2 is an exploded perspective view showing overall construction. It should be noted that each of these figures omit a package P and a lead L.

In these figures, an IC socket, according to the present invention, comprises a socket body 1, a cover 2 and a plurality of contacts 3, and further, a plurality of grooves (8 grooves 21 in FIG. 2) defining engaging sections are formed symmetrically about the sides of the central opening 24 of the socket cover 2 and spaced from the corner.

In further detail, at eight portions in the insides of the four side surfaces defining the central opening 24 of the cover 2, grooves 23 extending in an up and down (vertical) direction are formed along the entire length of the side surfaces. On the other hand, on the side surface of the socket body 1 and at positions respectively corresponding to the grooves 21 of the 8 grooves, eight vertically moving ribs 11 are formed. These ribs 11 engage with the grooves of the cover 2 for supporting the vertical motion of the cover 2 by maintaining the engaging condition. Accordingly, when the cover 2 is depressed by manual operation or operation of the automatic apparatus, the depression force is uniformly exerted on four side surfaces of the cover 2 so that the cover may be moved downwardly without causing tilting.

Figure 4:
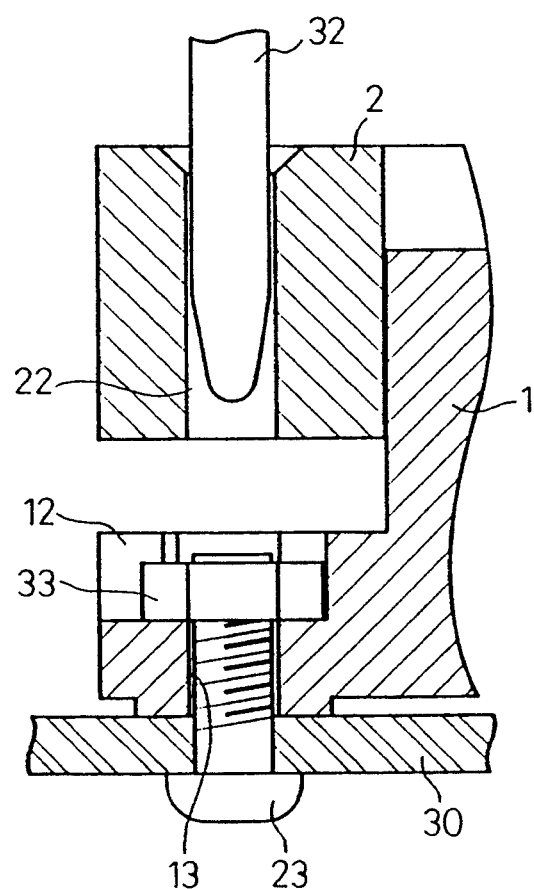
FIG. 4 is a detail sectional view taken along the line A—A of FIG. 1 showing the body joined to a circuit board and an alignment pin is in the opening.
Figure 5:
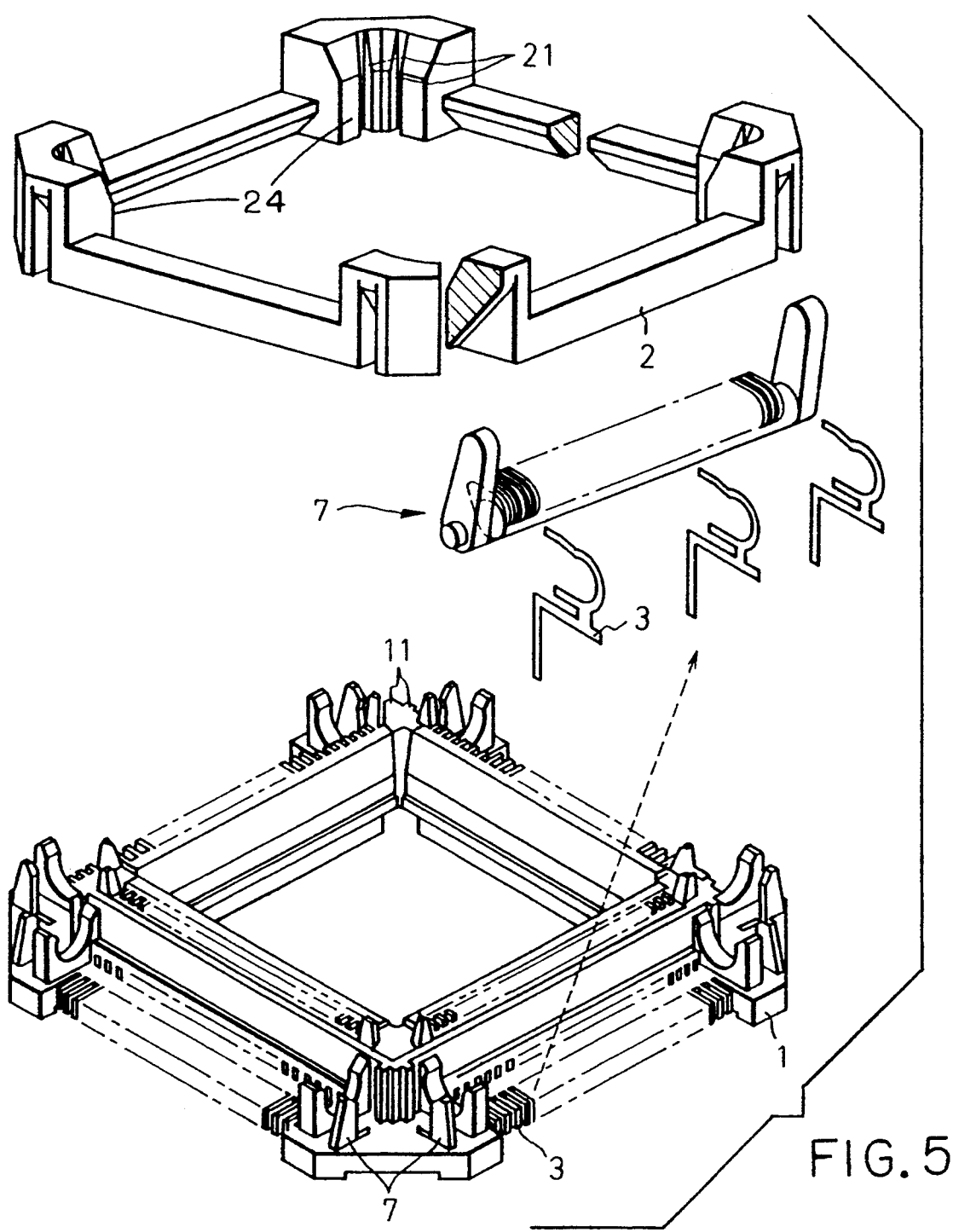
FIG. 5 is a perspective view of another embodiment of the IC socket according to the present invention.
Figure 6:
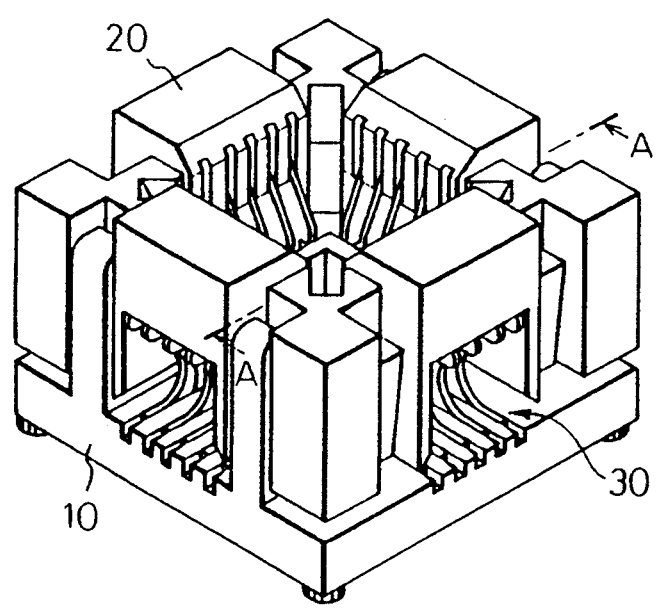
FIG. 6 is a perspective view of the conventional IC socket disclosed in U.S. Pat. No. 4,623,208 in the normal state before testing.
Figure 7:
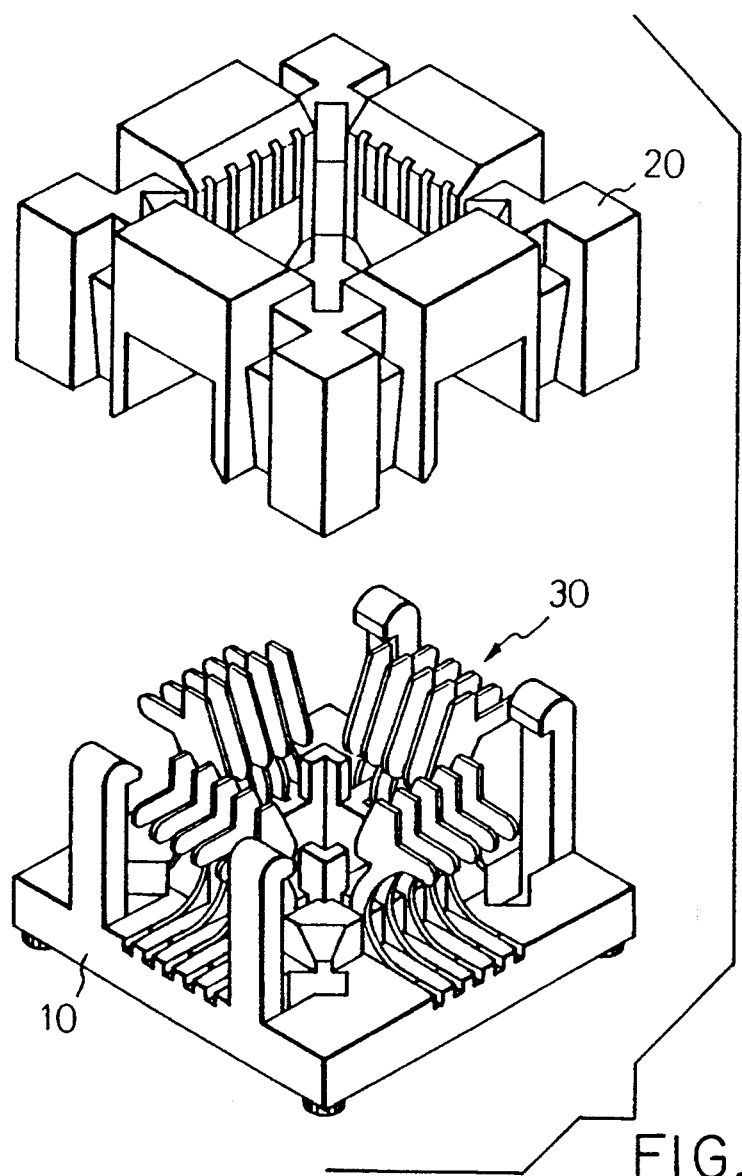
FIG. 7 is an exploded perspective view showing the overall construction of the conventional IC socket of U.S. Pat. No. 4,623,208.
Figure 8:
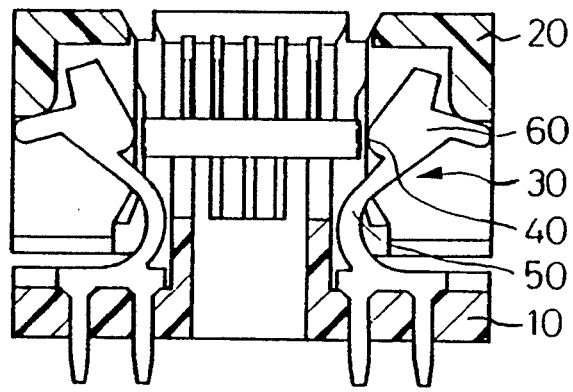
FIG. 8 is a sectional view of the conventional IC socket of U.S. Pat. No. 4,623,208, in a condition where the IC package is inserted, as taken along line A—A of FIG. 3.
Figure 9:
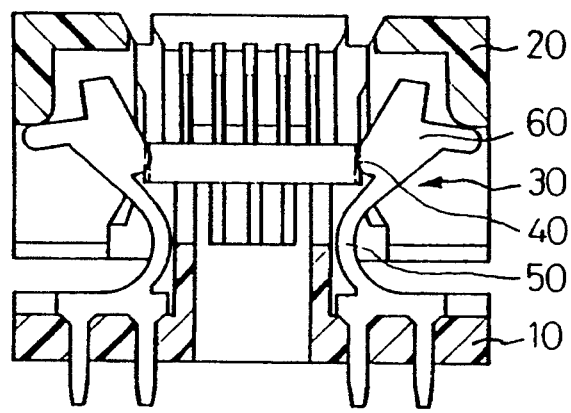
FIG. 9 is a sectional view of the conventional IC socket of U.S. Pat. No. 4,623,208, in a condition where the IC package is loaded, as taken along line A—A of FIG. 5.
Figure 10:
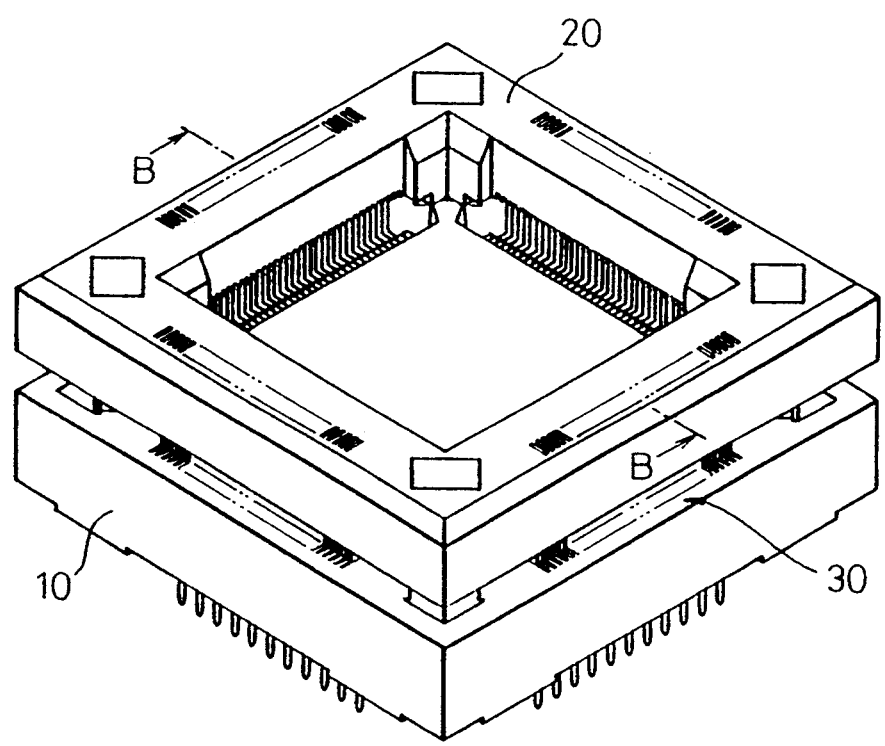
FIG. 10 is a perspective view of the conventional IC socket disclosed in U.S. Pat. No. 4,886,470, in the normal state before testing.
Figure 11:
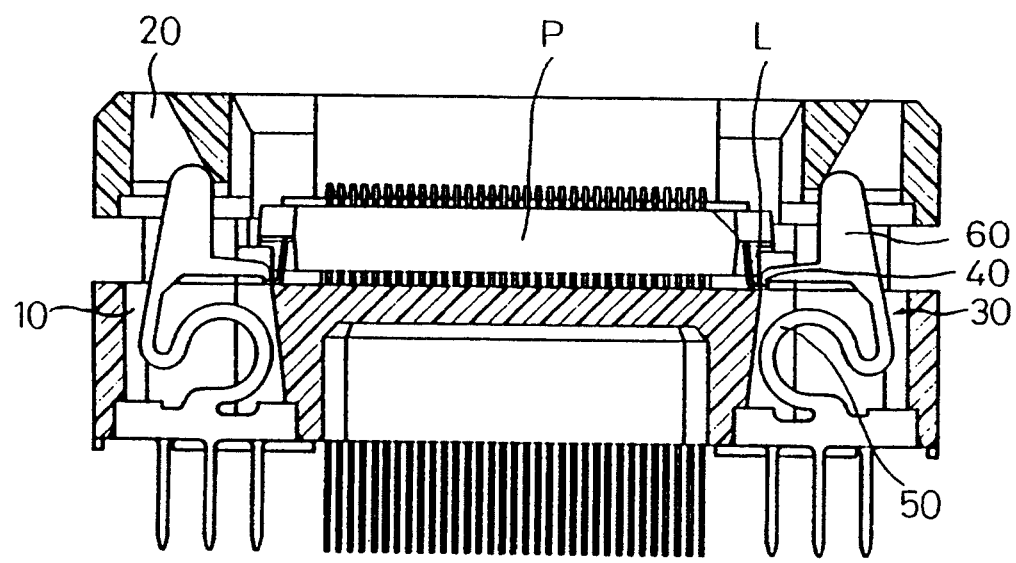
FIG. 11 is a sectional view of the conventional IC socket of U.S. Pat. No. 4,886,470, in a condition where a lead of the IC package is contacting a contact, as taken along line B—B of FIG. 10.
Figure 12:
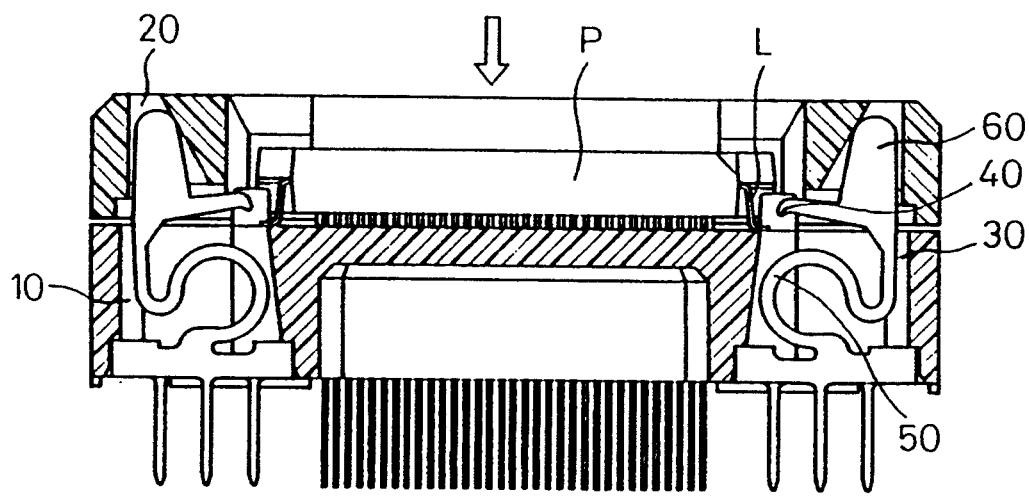
FIG. 12 is a sectional view of the conventional IC socket of U.S. Pat. No. 4,886,470, in a condition where the lead of the IC package and the contacts are not in contact, as taken along line B—B of FIG. 10.

Furthermore, since the grooves 21 and the ribs 11 are formed at positions other than the four corners of the socket, the four corners of the socket can be conveniently used for screw holes or positioning holes 22 for the automatic loader as illustrated in FIG. 4 and FIG. 5. Accordingly, the space of the socket body and the cover can be effectively used.

It should noted that, although the foregoing discussion is directed at the IC socket, in which the ribs and the grooves are formed respectively on the socket body and the cover, it is possible to alternatively provide an IC socket, in which the grooves are formed on the socket body and the ribs are formed on the cover.

FIG. 5 shows another embodiment of the IC socket according to the present invention, which is differentiated from the foregoing embodiment in that a cam lever 7 is further provided. Namely, in this embodiment, when the cover 2 is depressed downwardly, the cam lever 7 slidingly contacts the cover. The cam lever 7 is thus pivoted outwardly. The contact 3 further slidingly contacts the cam lever 7 and a contact portion of the contact 3 shifts upwardly in oblique in releasable fashion. Grooves 21 are formed in the cover adjacent the corners and ribs 11 are formed on the socket body 1. Other constructions and functions are similar to the foregoing embodiment.

The IC socket according to the present invention is also applicable for various types of ICs other the QFP and SOP, by selecting configurations of the socket body 1 and the cover 2. For example, DIP (Dual Inline Package), SIP (Single Inline Package), ZIP (Zigzag Inline Package), PGA (Pine Grid Array), SOI (Small Outline I-Leaded Package), SOJ (Small Outline J-Leaded Package), (SON (Small Outline Non-Leaded Package), QFI (Quad Flat I-Leaded Package) QFJ (Quad Flat J-Leaded Package), QFN (Quad Flat Non-Leaded Package) and so forth.

As set forth above, according to the present invention, it can be realized that the IC package provides a functioning section for preventing the cover from tilting during operation, without providing guide posts and so forth at four corners of the socket body at the cover. As a result, loading and unloading of the IC package can be done smoothly, and the space at four corners of the socket can be effectively used.

I claim:
1. An IC socket including:
a socket body formed with a support to receive an IC package and means supporting a plurality of contacts for electrical contact with leads of said IC package; and
a cover fitted on said socket body and having a central opening defined by four side surfaces for releasibly loading said IC package on said socket body by vertical movement of said cover in relationship to said socket body, wherein a plurality of guide sections extending vertically are formed on the four side surfaces of said cover, said guide section being defined by two grooves formed in each of the four side surfaces defining the opening in said cover and that the grooves are spaced from the corners of said central opening, and
said socket body comprising a plurality of engaging sections for engaging with said guide sections, supporting vertical movement of said cover in relationship to said socket body and restricting said cover from tilting during testing of said IC package, said engaging sections being formed respectively, on four side surfaces of said socket body forming said support for a said IC package, said engaging sections being defined by two ribs formed on each of the four side surfaces of the socket body support, which ribs are received in said grooves of said cover to restrict tilting when the cover is moved vertically toward the socket body.

* * * * *